(12) United States Patent (10) Patent No.: US 7,812,624 B1
Wei et al. (45) Date of Patent: Oct. 12, 2010

(54) TESTING METHOD FOR LED MODULE

(75) Inventors: Chih-Hung Wei, Tu Cheng (TW);
Ming-Chang Wu, Tu Cheng (TW);
Chih-Yang Hsu, Tu Cheng (TW);
Chih-Lung Wu, Tu Cheng (TW);
Ding-Yuan Jheng, Tu Cheng (TW)

(73) Assignee: High Power Lighting Corp., Taipei (TW)

( * ) Notice: Subject to any disclaimer, the term of this patent is extended or adjusted under 35 U.S.C. 154(b) by 24 days.

(21) Appl. No.: 12/471,627

(22) Filed: May 26, 2009

(51) Int. Cl.
*G01R 31/302* (2006.01)
(52) U.S. Cl. ...................................... 324/750; 324/753
(58) Field of Classification Search ........................ None
See application file for complete search history.

(56) References Cited

U.S. PATENT DOCUMENTS 6,028,441 A * 2/2000 Alvord et al. ................ 324/767
7,129,722 B1 * 10/2006 Brophy et al. ............... 324/753

* cited by examiner

*Primary Examiner*—Minh N Tang
(74) *Attorney, Agent, or Firm*—Chun-Ming Shih; HDLS IPS Services (57) ABSTRACT

A testing method for a LED module and its associated elements includes the steps of: providing a LED module on which a plurality of light-emitting diodes is arranged; providing an integration detector, and mounting it above the LED module; providing an electrically conducting means having a plurality of conductive terminals and an electronic signal connector electrically connected to the conductive terminals; electrically connecting the light-emitting diodes with the conductive terminals; using the electronic signal connector to change the ON/OFF states of the electrical signals of the light-emitting diodes and the conductive terminals; and detecting the photo-electrical properties of each light-emitting diode via the integration detector.

15 Claims, 8 Drawing Sheets

TESTING METHOD FOR LED MODULE

BACKGROUND OF THE INVENTION

1. Field of the Invention

The present invention relates to a testing method, and in particular to a testing method for a LED module and its associated elements.

2. Description of Prior Art

Recently, light emitting diodes (LED) are widely used for illumination, such as in a flashlight, tail lamp or indicator of a motorcycle (automobile) and traffic light. The above-mentioned lamps are constituted of a plurality of light-emitting diodes. If one of the light-emitting diodes suffers damage to fail to emit light, the light-emitting efficiency of this lamp is deteriorated. Thus, it is an important issue to guarantee the yield in manufacturing light-emitting diodes.

Therefore, after the light-emitting diodes are manufactured completely, they have to be tested before leave the factory, thereby guaranteeing their normal operation. The conventional testing device for LED is an integrating sphere measurement device. However, when the integrating sphere measurement device is used to test the light-emitting diodes, it has to be aligned with the light-emitting diodes for testing. Alternatively, the integrating sphere measurement device is fixed while moving the light-emitting diode, so that the light-emitting diode to be tested is exactly located below the integrating sphere measurement device for testing.

However, in practice, such a testing method still has a problem that each of the light-emitting diodes or the integrating sphere measurement device has to be moved during the test. As a result, if the number of the light-emitting diodes to be tested is increased, it will take a lot of time to move the light-emitting diodes or the integrating sphere measurement device, so that the efficiency in testing cannot be improved.

Therefore, the present Inventor aims to solve the above problem.

SUMMARY OF THE INVENTION

The present invention is to provide a testing method for a LED module and its associated elements. Via the control of an electronic signal connector, the plurality of light-emitting diodes on the LED module can be lighted sequentially, so that an integrating sphere measurement device can be used to test the light-emitting diodes. In this way, the time for moving the light-emitting diodes can be saved, thereby increasing the efficiency in testing.

The present invention is to provide a testing method for a LED module, which includes the steps of: (a) providing a LED module on which a plurality of light-emitting diodes are arranged; (b) providing an integration detector, and mounting it above the LED module; (c) providing an electrically conducting means having a plurality of conductive terminals and an electronic signal connector electrically connected to the conductive terminals; (d) electrically connecting the light-emitting diodes with the conductive terminals; (e) using the electronic signal connector to change the ON/OFF state of the electrical signals of the light-emitting diodes and the conductive terminals; and (f) detecting the photo-electrical properties of each light-emitting diode via the integration detector.

In comparison with prior art, the present invention has solved the problem that the light-emitting diodes conventionally have to be positioned on a one-dimensional or two-dimensional displacing means to make each of the light-emitting diodes to be aligned with the integration detector for testing. According to the present invention, the integration detector covers the LED module and the electronic signal connector is used to control the ON/OFF state of each light-emitting diode, so that the integration detector can detect each of the light-emitting diodes easily. As a result, the time for moving each of the light-emitting diodes can be saved, and thus the efficiency in testing can be improved.

DETAILED DESCRIPTION OF THE INVENTION

The detailed description and technical contents of the present invention will be explained with reference to the accompanying drawings. However, the drawings are illustrative only but not used to limit the present invention.

Figure 1:
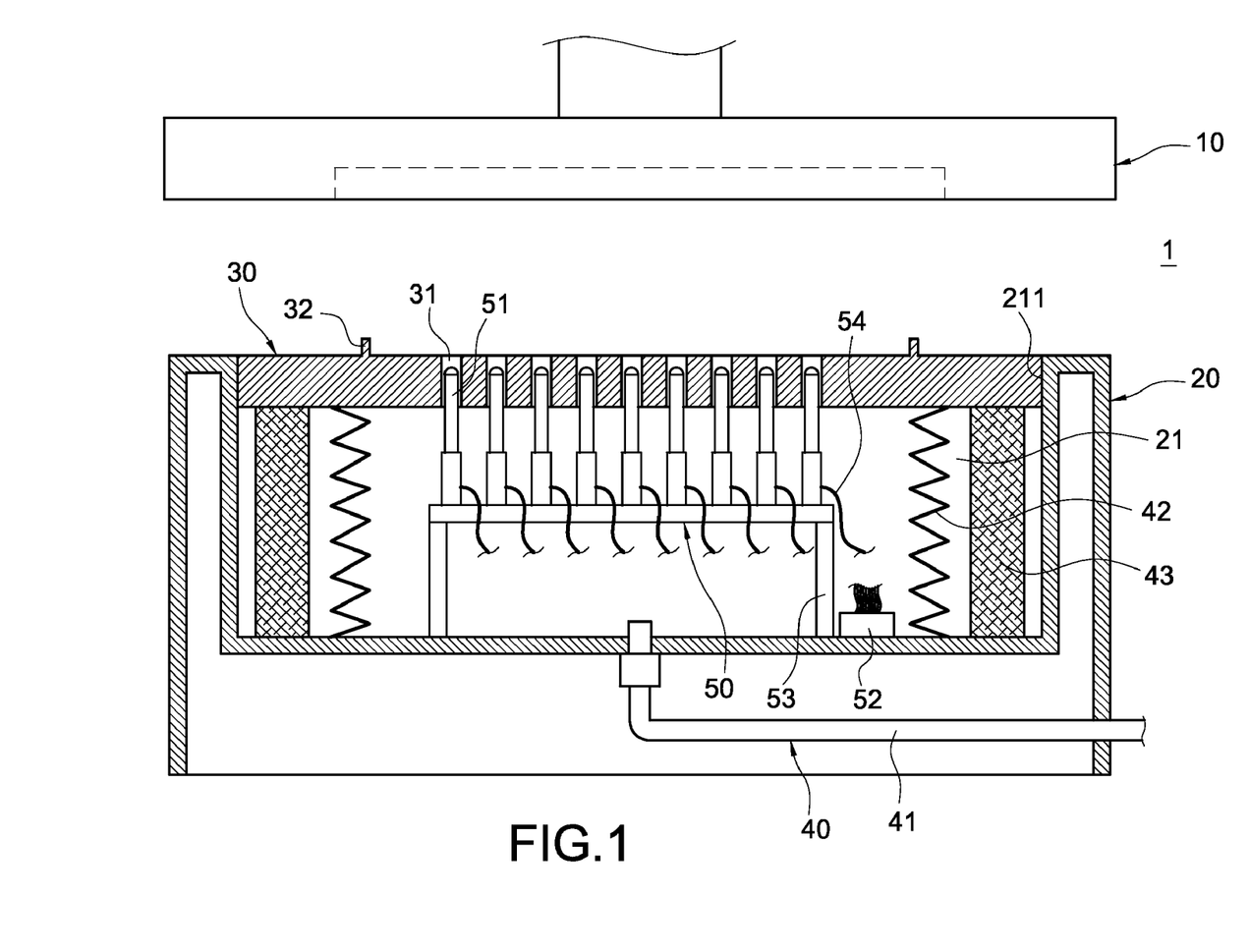
FIG. 1 is a cross-sectional perspective view showing the testing device of the present invention.
Figure 2:
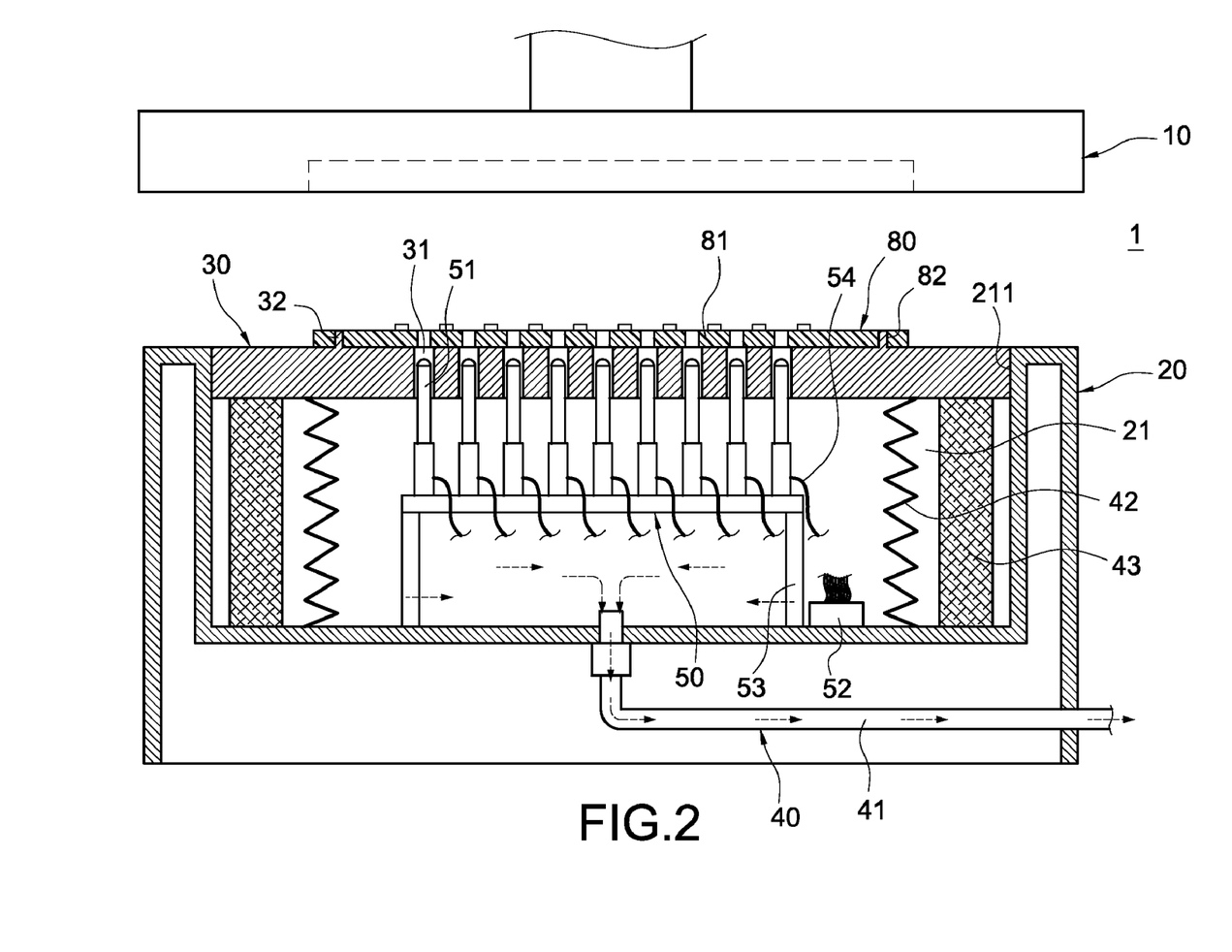
FIG. 2 is a cross-sectional view (I) showing the operating state of the testing device of the present invention.
Figure 3:
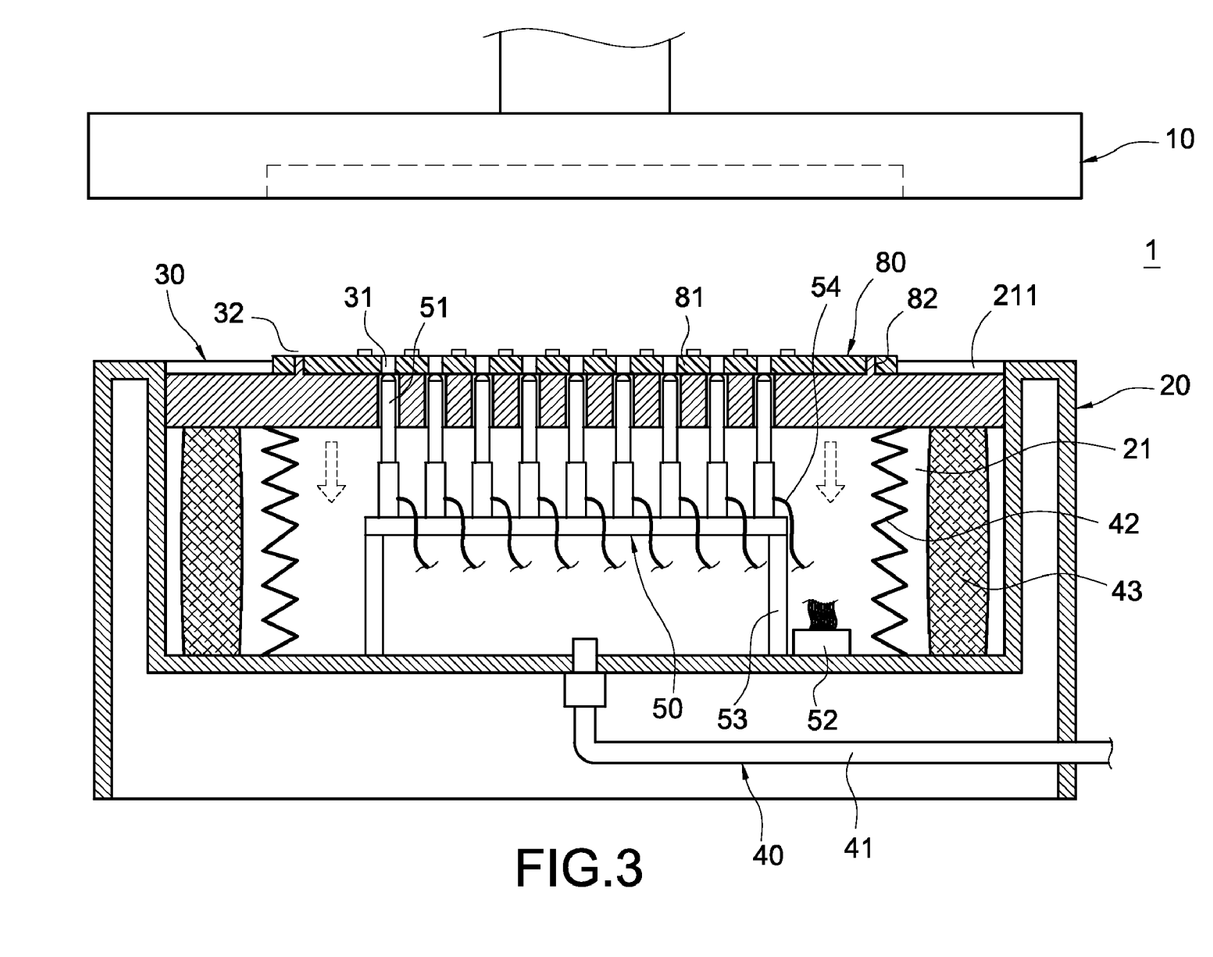
FIG. 3 is a cross-sectional view (II) showing the operating state of the testing device of the present invention.

Please refer to FIGS. 1 to 3. FIG. 1 is a cross-sectional perspective view showing the testing device of the present invention, FIG. 2 is a cross-sectional view (I) showing the operating state of the testing device of the present invention, and FIG. 3 is a cross-sectional view (II) showing the operating state of the testing device of the present invention. The present invention provides a testing method for a LED module 80. A plurality of light-emitting diodes 81 are arranged on the LED module 80. The testing device 1 used in this testing method includes an integration detector 10, a casing 20, a supporting plate 30, a transmission means 40 and an electrically connecting means 50.

The integration detector 10 is arranged to correspond to the LED module 80 in such a manner that it is located above the LED module 80.

The interior of the casing 20 is formed with an accommodating chamber 21. One side of the accommodating chamber 21 is formed with an opening 211. In the present embodiment, the opening 211 is formed on the top surface of the casing 20, but it is not limited thereto.

The supporting plate 30 corresponds to the opening 211 and covers the accommodating chamber 21. The supporting plate 30 is able to move upwards and downwards with respect to the casing 20. The supporting plate 30 is provided with a plurality of through-holes 31. The outside of the through-holes 31 is provided with a plurality of positioning pins 32. The LED module 80 is disposed on the supporting plate 30. The LED module 80 is provided with a plurality of bores 82 for allowing the positioning pins 32 to pass through, whereby the LED module 80 can be positioned on the supporting plate 30.

The transmission means 40 is fixed in the casing 20 for driving the supporting plate 30 to move with respect to the casing 20. More specifically, in the present embodiment, the transmission means 40 comprises an air-drawing pipe 41, a plurality of elastic elements 42 and an airtight wall 43. However, the transmission means 40 is not limited thereto. The air-drawing pipe 41 is connected to the casing 20 to make the accommodating chamber 21 to be in communication with the outside. The elastic element 42 is a compression spring. Both ends of the elastic element 42 abut the bottom surface of the supporting plate 30 and the bottom surface of the accommodating chamber 21 respectively. The airtight wall 43 is disposed between the supporting plate 30 and the bottom surface of the accommodating chamber 21. The airtight wall 43 is made of a soft material, which is compressible. The airtight wall 43 makes the interior of the accommodating chamber 21 to be isolated from the outside. Via the air-drawing pipe 41, the interior of the accommodating chamber 21 generates a negative pressure, so that the supporting plate 30 can be lowered due to the pressure difference.

The electrically connecting means 50 is disposed in the accommodating chamber 21. The electrically connecting means 50 comprises a plurality of conductive terminals 51, an electronic signal connector 52, a frame 53 and a plurality of leads 54.

The frame 53 is provided on the surface of the accommodating chamber 21. One end of the conductive terminal 51 is connected to the frame 53, and the other end of the conductive terminal 51 penetrates into the through-hole 31. The conductive terminals 51 are electrically connected to the electronic signal connector 52 via the leads 54. The electronic signal connector 52 is used to control the ON/OFF state of the conductive terminals 51. The transmission means 40 drives the supporting plate 30 to move, whereby the light-emitting diodes 81 are electrically connected with the conductive terminals 51. The change between the ON/OFF states of the electronic signal connector 52 makes the light-emitting diodes 81 to be turned on/off, which can be detected by the integration detector 10. The testing procedure will be described in more detail later.

Figure 4:
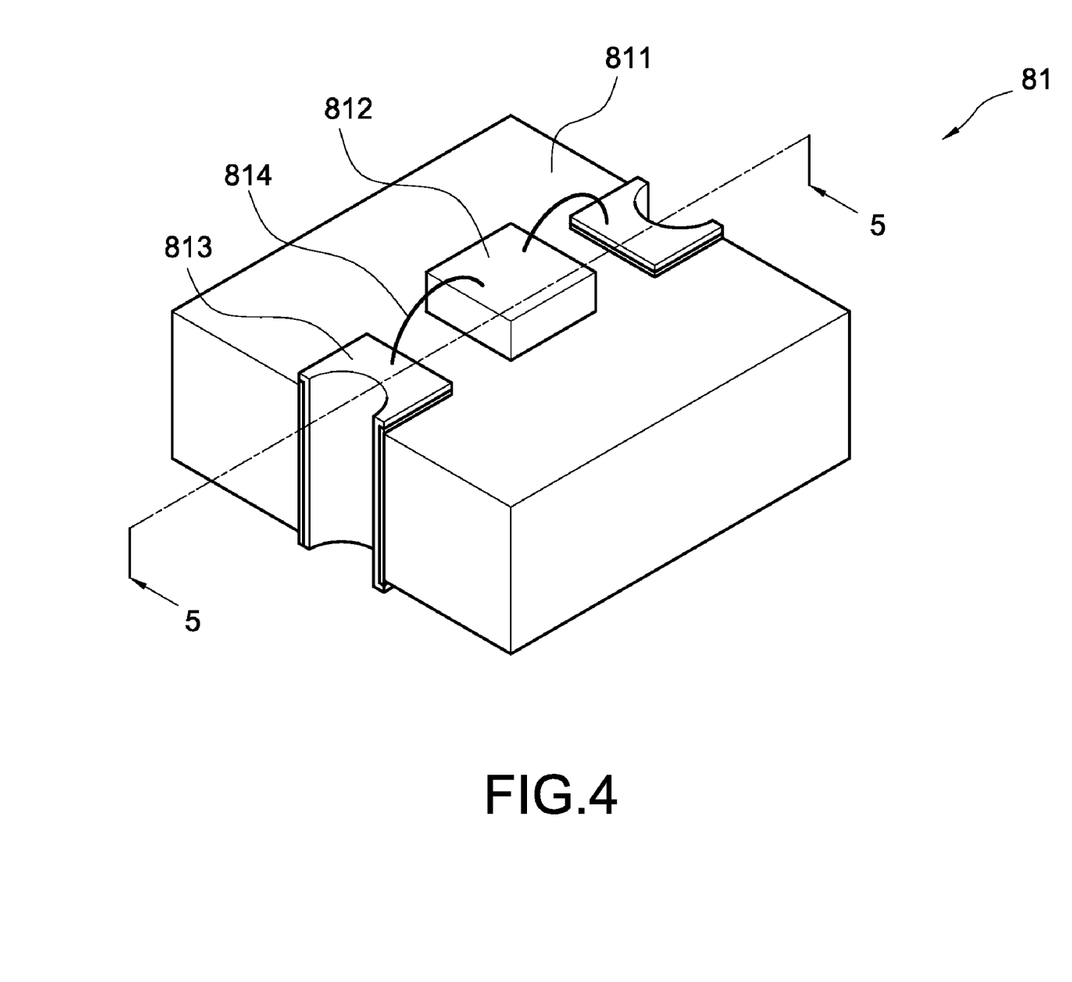
FIG. 4 is a perspective view showing the external appearance of a light-emitting diode.
Figure 5:
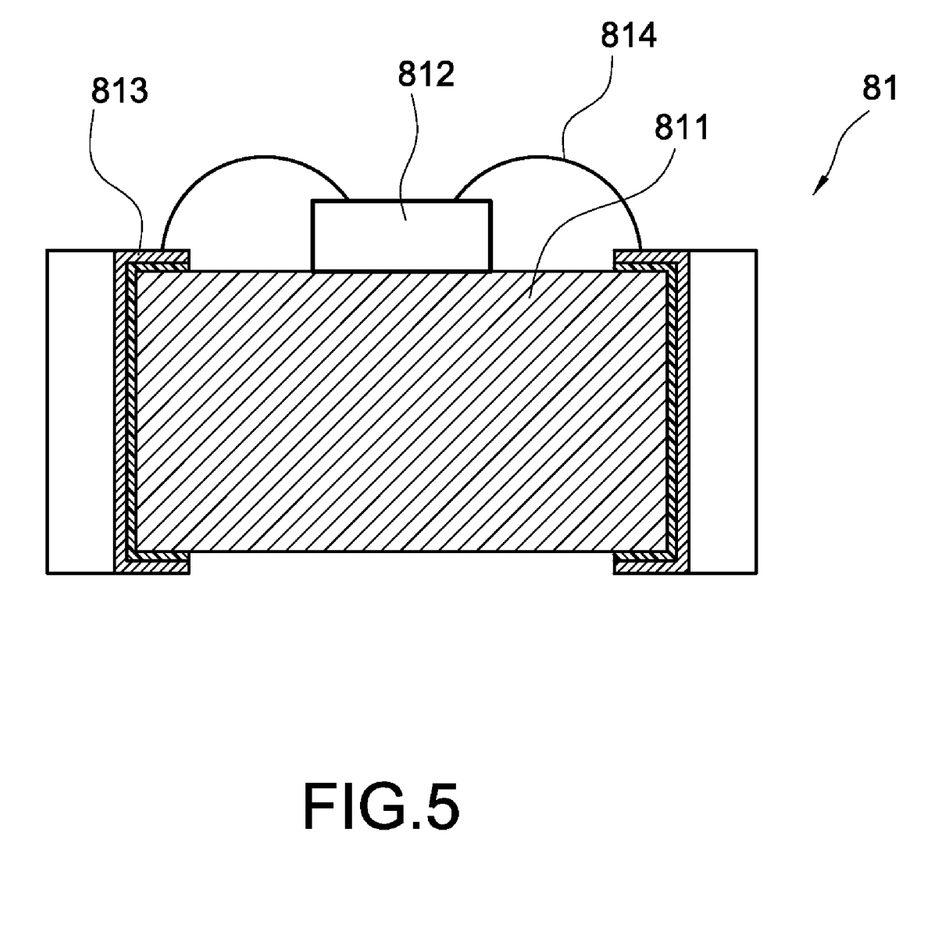
FIG. 5 is a cross-sectional view taken along the line 5-5 of FIG. 4.

Please refer to FIGS. 4 and 5. FIG. 4 is a perspective view showing the external appearance of a light-emitting diode, and FIG. 5 is a cross-sectional view taken along the line 5-5 of FIG. 4.

Please also refer to FIGS. 2 and 3. The air-drawing pipe 41 draws the air in the accommodating chamber 21, so that the supporting plate 30 can be lowered due to the pressure difference. The supporting plate 30 moves downwards until the conductive terminals 51 are brought into contact with the bottom of the LED module 80.

The light-emitting diode 81 includes a heat-dissipating block 811, a chip 812, a plurality of conductive layers 813 and a plurality of golden wires 814. The chip 812 is adhered to the top surface of the heat-dissipating block 811. The conductive layers 813 are provided on both sides of the heat-dissipating block 811 and are exposed to the upper, lower and side surfaces of the heat-dissipating block 811. The golden wires 814 are connected to the chip 812 and the conductive layers 813.

When the conductive terminals 51 are brought into contact with the bottom of the LED module 80, the conductive terminals 51 will abut the bottom of the conductive layers 813 of the light-emitting diode 81. Since the LED module 80 has a plurality of light-emitting diodes 81, the conductive terminals 51 can be brought into contact with the conductive layers 813 of all the light-emitting diodes 81 at the same time.

Subsequently, the electronic signal connector 52 controls the conductive terminals 51 to be powered on, so that the light-emitting diodes 81 can be turned on in order. Then, the integration detector 10 can detect the light-emitting diodes 81 one by one. Therefore, only the LED module 80 is fixed on the supporting plate 30 without moving with respect to the integration detector 10, thereby the time for testing can be saved.

Figure 6:
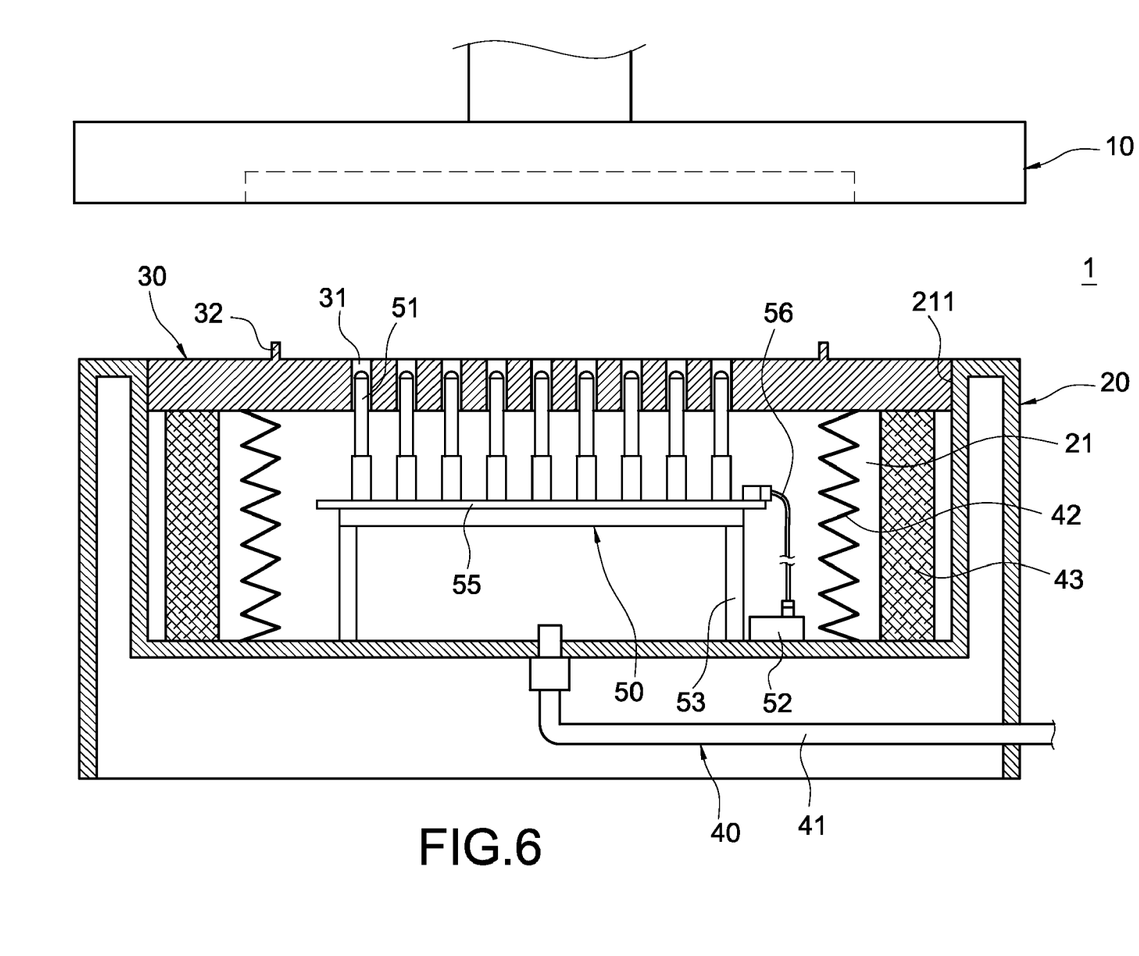
FIG. 6 is a cross-sectional perspective view showing the testing device of another embodiment of the present invention.

Please refer to FIG. 6, which is a cross-sectional perspective view showing the testing device of another embodiment of the present invention. In the present embodiment, the electrically connecting means 50 further comprises a circuit board 55 and a flat cable 56. The circuit board 55 is overlapped on the frame 53. The conductive terminals 51 are connected on the circuit board 55. The flat cable 56 is connected to one end of the circuit board 55. Such a connection makes the arrangement of leads of the electrically connecting means 50 more simple.

Figure 7:
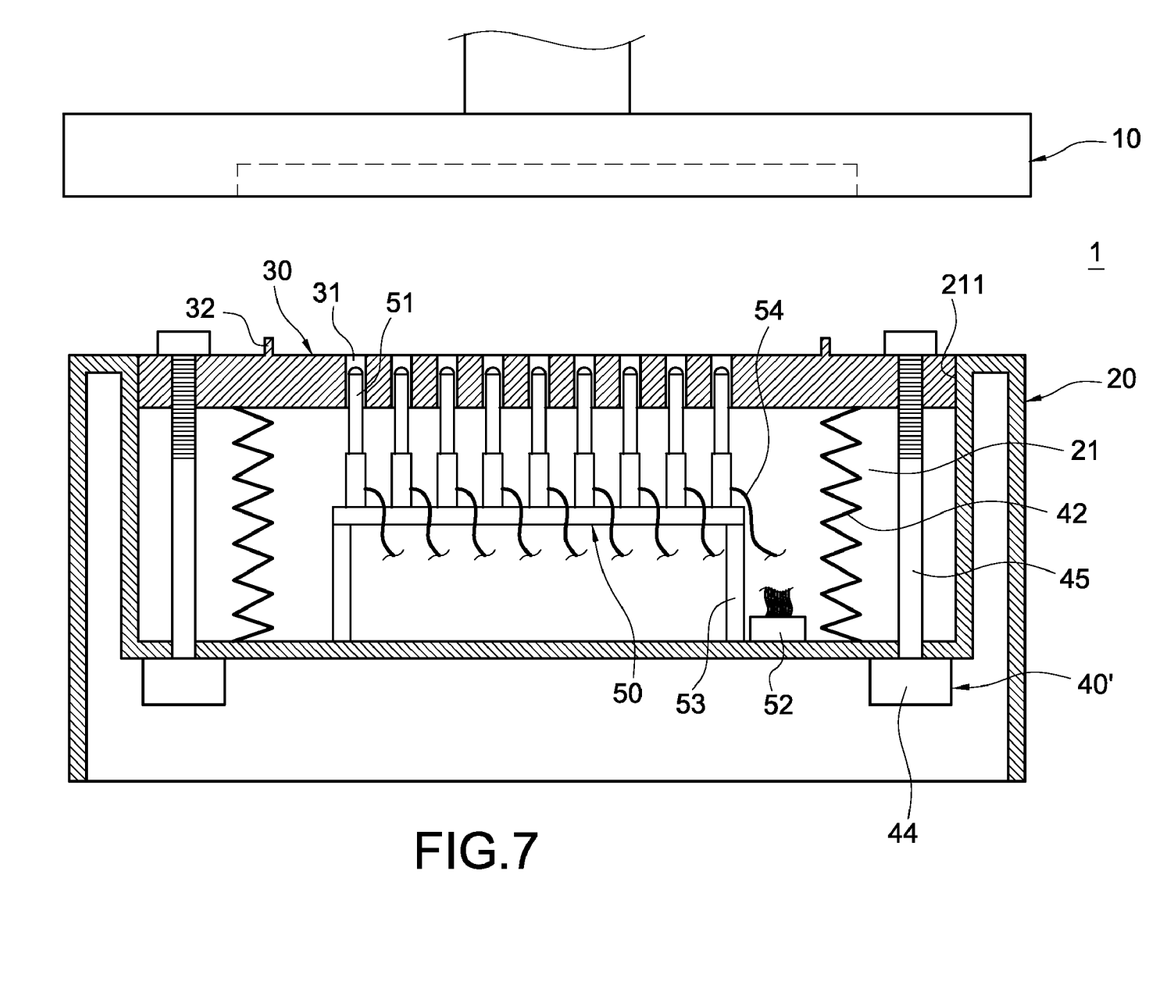
FIG. 7 is a cross-sectional perspective view showing the testing device of a further embodiment of the present invention.

Please refer to FIG. 7, which is a cross-sectional perspective view showing the testing device of a further embodiment of the present invention. In the present embodiment, the transmission means 40' can be modified into another form. The transmission means 40' comprises a motor 44 and a plurality of screw rods 45 connecting to the supporting plate 30. The screw rod 45 is engaged with the motor 44 and thus is driven by the motor 44. In this way, the supporting plate 30 can be moved upwards and downwards with respect to the casing 20.

Figure 8:
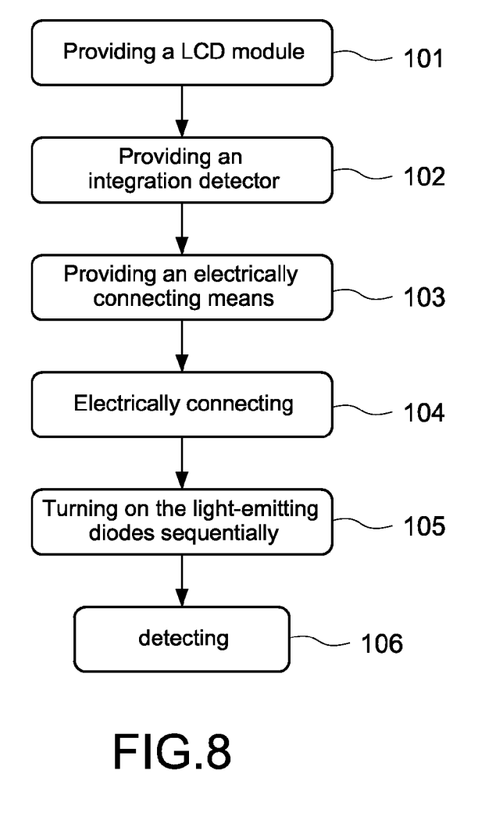
FIG. 8 is a flow chart showing the test method for a LED module according to the present invention.

Please refer to FIG. 8, which is a flow chart showing the test method for a LED module according to the present invention. The present invention provides a testing method for a LED module 80, which includes the steps as follows.

In step 101, a LED module 80 is provided, on which a plurality of light-emitting diodes 81 is arranged.

In step 102, an integration detector 10 is provided. The integration detector 10 is mounted above the LED module 80 to cover the LED module 80.

In step 103, an electrically conducting means 50 having a plurality of conductive terminals 51 and an electronic signal connector 52 electrically connected to the conductive terminals 51 is provided.

In step 104, the light-emitting diodes 81 are electrically connected with the conductive terminals 51.

In step 105, the electronic signal connector 52 is used to change the ON/OFF states of the electrical signals of the light-emitting diodes 81 and the conductive terminals 51.

In step 106, the photo-electrical properties of each light-emitting diode 81 are detected by the integration detector 10.

The integration detector 10 can detect many properties of the light-emitting diode 81, such as spectrum, color coordinate, color temperature, dominant wavelength, peak wavelength, color rendering, Lumens, saturation, luminous flux and etc.

According to the above, the testing device for a LED module and the testing method for a LED module in accordance with the present invention really demonstrate industrial applicability, novelty and inventive steps. Further, the construction of the present invention has not been seen in products of the same kind and used in public. Therefore, the present invention conforms to the requirements for an invention patent.

What is claimed is:

1. A testing method for LED module, comprising the steps of:
   a) providing a LED module on which a plurality of light-emitting diodes is arranged;
   b) providing an integration detector, and mounting the integration detector above the LED module;
   c) providing an electrically conducting means having a plurality of conductive terminals and an electronic signal connector electrically connected to the conductive terminals;
   d) electrically connecting the light-emitting diodes with the conductive terminals;

e) using the electronic signal connector to change ON/OFF states of electrical signals of the light-emitting diodes and the conductive terminals; and f) detecting photo-electrical properties of each light-emitting diode via the integration detector.

2. The testing method for LED module according to claim 1, wherein the integration detector mentioned in the step b) covers the LED module.

3. The testing method for LED module according to claim 1, wherein the integration detector mentioned in the step f) detects each of the light-emitting diodes.

4. The testing method for LED module according to claim 1, wherein the integration detector mentioned in the step f) detects the spectrum, color coordinate, color temperature, dominant wavelength, peak wavelength, color rendering, Lumens, saturation, and luminous flux of each light-emitting diode.

5. The testing method for LED module according to claim 1, wherein a supporting plate is further provided in the step a), the supporting plate is provided with a plurality of through-holes, and the LED module is disposed on the supporting plate.

6. The testing method for LED module according to claim 5, wherein one surface of the supporting plate is formed with a plurality of positioning pins that are located outside the through-holes for positioning the LED module.

7. The testing method for LED module according to claim 5, wherein a transmission means connected to the supporting plate is further provided in the step a) for driving the supporting plate to move.

8. The testing method for LED module according to claim 7, wherein a casing is further provided in the step a), an interior of the casing is formed with an accommodating chamber, one side of the accommodating chamber is formed with an opening, and the supporting plate corresponds to the opening and covers the accommodating chamber.

9. The testing method for LED module according to claim 8, wherein the transmission means comprises an air-drawing pipe, a plurality of elastic elements and an airtight wall, the air-drawing pipe is connected to the casing and makes the accommodating chamber to be in communication with the outside, both ends of the elastic element abut the bottom surface of the supporting plate and a button surface of the accommodating chamber, the airtight wall is disposed between the supporting plate and the bottom surface of the accommodating chamber, and the air-drawing pipe draws the air within the accommodating chamber to make the supporting plate to move downwards by the pressure difference.

10. The testing method for LED module according to claim 9, wherein the elastic element is a compression spring.

11. The testing method for LED module according to claim 9, wherein the airtight wall is a soft material.

12. The testing method for LED module according to claim 8, wherein the transmission means comprises a motor and a plurality of screw rods connected to the supporting plate, and the screw rods are engaged with the motor and thus are driven by the motor, thereby making the supporting plate to move upwards and downwards with respect to the casing.

13. The testing method for LED module according to claim 5, wherein one end of the conductive terminals penetrates into the through-holes respectively in the step c).

14. The testing method for LED module according to claim 13, wherein the electrically connecting means further comprises a frame and a plurality of leads, the frame is disposed on the surface of the accommodating chamber, the conductive terminals are connected to the frame, and the conductive terminals are electrically connected with the electronic signal connector via the leads.

15. The testing method for LED module according to claim 13, wherein the electrically connecting means further comprises a frame, a circuit board and a flat cable, the frame is disposed on the surface of the accommodating chamber, the circuit board is overlapped on the frame, the conductive terminals are connected on the circuit board, and the flat cable is connected to one end of the circuit board.

* * * * *